US008595683B1

(12) United States Patent
de Buren et al.

(10) Patent No.: US 8,595,683 B1
(45) Date of Patent: Nov. 26, 2013

(54) GENERATING USER CLOCKS FOR A PROTOTYPING ENVIRONMENT

(75) Inventors: Philip H. de Buren, San Francisco, CA (US); Subramanian Ganesan, Saratoga, CA (US); Jinny Singh, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/445,618

(22) Filed: Apr. 12, 2012

(51) Int. Cl.
*G06F 17/50* (2006.01)
*H03K 19/173* (2006.01)
*G06F 9/455* (2006.01)

(52) U.S. Cl.
USPC ........... 716/137; 716/116; 716/117; 716/134; 703/28; 326/37; 326/38

(58) Field of Classification Search
USPC .................... 716/116–117, 134, 137; 703/28; 326/37–38
See application file for complete search history.

(56) References Cited

U.S. PATENT DOCUMENTS

| | | | |
|---|---|---|---|
| 4,306,286 A | 12/1981 | Cocke et al. |
| 4,642,487 A | 2/1987 | Carter |
| 4,656,580 A | 4/1987 | Hitchcock, Sr. et al. |
| 4,695,740 A | 9/1987 | Carter |
| 4,695,999 A | 9/1987 | Lebizay |
| 4,697,241 A | 9/1987 | Lavi |
| 4,706,216 A | 11/1987 | Carter |
| 4,713,557 A | 12/1987 | Carter |
| 4,758,745 A | 7/1988 | Elgamal et al. |
| 4,758,985 A | 7/1988 | Carter |
| 4,870,302 A | 9/1989 | Freeman |
| 4,873,459 A | 10/1989 | El Gamal et al. |
| 4,914,612 A | 4/1990 | Beece et al. |
| 5,036,473 A | 7/1991 | Butts et al. |
| 5,083,083 A | 1/1992 | El-Ayat et al. |
| 5,093,920 A | 3/1992 | Agrawal et al. |
| 5,109,353 A | 4/1992 | Sample et al. |
| 5,114,353 A | 5/1992 | Sample |
| 5,231,588 A | 7/1993 | Agrawal et al. |
| 5,233,539 A | 8/1993 | Agrawal et al. |
| 5,259,006 A | 11/1993 | Price et al. |
| 5,329,470 A | 7/1994 | Sample et al. |
| 5,352,123 A | 10/1994 | Sample et al. |

(Continued)

OTHER PUBLICATIONS

Clock Networks and PLLs in Stratix IV Devices; Stratix IV Device Handbook vol. 1; Dec. 2011.

(Continued)

*Primary Examiner* — Stacy Whitmore
(74) *Attorney, Agent, or Firm* — Dickstein Shapiro LLP

(57) ABSTRACT

A method and apparatus for generating user clocks in a prototyping system is disclosed. A prototyping system has a plurality of programmable logic chips that are each programmed with one or more partition of a prototyped circuit design. For a circuit design having multiple user clock signals, each partition uses some or all of the user clocks. A reference clock signal is externally generated, and received by each of the programmable logic chips. Using a phase-locked loop, a plurality of in-phase higher frequency clock signals are generated from the reference clock signal. The user clock signals are then generated from these higher frequency signals using a plurality of divider circuits. Reset circuitry implemented in one of the programmable logic chips transmits a common reset signal to the divider circuits, maintaining the phase relationship of each user clock across the programmable logic chips.

17 Claims, 7 Drawing Sheets

(56) References Cited

U.S. PATENT DOCUMENTS

| | | | |
|---|---|---|---|
| 5,377,124 | A | 12/1994 | Mohsen |
| 5,400,262 | A | 3/1995 | Mohsen |
| 5,414,638 | A | 5/1995 | Verheyen et al. |
| 5,425,036 | A | 6/1995 | Liu et al. |
| 5,448,496 | A | 9/1995 | Butts et al. |
| 5,448,522 | A | 9/1995 | Huang |
| 5,452,231 | A | 9/1995 | Butts et al. |
| 5,452,239 | A | 9/1995 | Dai et al. |
| 5,475,830 | A | 12/1995 | Chen et al. |
| 5,477,475 | A | 12/1995 | Sample et al. |
| 5,530,958 | A | 6/1996 | Agarwal et al. |
| 5,544,069 | A | 8/1996 | Mohsen |
| 5,563,829 | A | 10/1996 | Huang |
| 5,574,388 | A | 11/1996 | Barbier et al. |
| 5,596,742 | A * | 1/1997 | Agarwal et al. ............ 326/37 |
| 5,612,891 | A | 3/1997 | Butts et al. |
| 5,644,515 | A | 7/1997 | Sample et al. |
| 5,649,176 | A | 7/1997 | Selvidge et al. |
| 5,659,716 | A * | 8/1997 | Selvidge et al. ............ 703/23 |
| 5,680,583 | A | 10/1997 | Kuijsten |
| 5,715,172 | A | 2/1998 | Tzeng |
| 5,754,827 | A | 5/1998 | Barbier et al. |
| 5,761,484 | A * | 6/1998 | Agarwal et al. ............ 326/38 |
| 5,777,489 | A | 7/1998 | Barbier et al. |
| 5,790,832 | A | 8/1998 | Barbier et al. |
| 5,819,065 | A | 10/1998 | Chilton et al. |
| 5,822,564 | A | 10/1998 | Chilton et al. |
| 5,835,751 | A | 11/1998 | Chen et al. |
| 5,841,967 | A | 11/1998 | Sample et al. |
| 5,884,066 | A | 3/1999 | Kuijsten |
| 5,886,904 | A | 3/1999 | Dai et al. |
| 5,920,712 | A * | 7/1999 | Kuijsten ............ 703/23 |
| 5,923,865 | A | 7/1999 | Chilton et al. |
| 5,943,490 | A | 8/1999 | Sample |
| 5,960,191 | A | 9/1999 | Sample et al. |
| 5,963,735 | A | 10/1999 | Sample et al. |
| 6,009,652 | A * | 1/2000 | Smith ............ 40/610 |
| 6,058,492 | A | 5/2000 | Sample et al. |
| 6,112,308 | A * | 8/2000 | Self et al. ............ 713/400 |
| 6,141,636 | A | 10/2000 | Sarno et al. |
| 6,289,494 | B1 | 9/2001 | Sample et al. |
| 6,377,911 | B1 * | 4/2002 | Sample et al. ............ 703/24 |
| 6,377,912 | B1 | 4/2002 | Sample et al. |
| 6,446,249 | B1 | 9/2002 | Wang et al. |
| 6,539,535 | B2 | 3/2003 | Butts et al. |
| 6,625,793 | B2 | 9/2003 | Sample et al. |
| 6,694,464 | B1 | 2/2004 | Quayle et al. |
| 6,697,957 | B1 | 2/2004 | Wang et al. |
| 6,832,185 | B1 | 12/2004 | Musselman et al. |
| 6,842,729 | B2 | 1/2005 | Sample et al. |
| 7,006,960 | B2 * | 2/2006 | Schaumont et al. ............ 703/15 |
| 7,109,752 | B1 | 9/2006 | Schmit et al. |
| 7,260,794 | B2 | 8/2007 | Butts |
| 7,290,224 | B2 * | 10/2007 | Byrn et al. ............ 716/102 |
| 7,555,424 | B2 | 6/2009 | Kfir et al. |
| 7,721,036 | B2 | 5/2010 | Poplack et al. |
| 7,739,097 | B2 * | 6/2010 | Sample et al. ............ 703/19 |
| 7,827,023 | B2 | 11/2010 | Beausoleil et al. |
| 7,876,124 | B2 * | 1/2011 | Okyay et al. ............ 326/38 |
| 7,904,288 | B1 | 3/2011 | Beausoleil et al. |
| 7,908,465 | B1 | 3/2011 | Poplack et al. |
| 7,945,878 | B2 * | 5/2011 | Youngman et al. ............ 716/104 |
| 8,188,766 | B1 * | 5/2012 | Cheah et al. ............ 326/93 |
| 2001/0049593 | A1 * | 12/2001 | Mc Connell et al. ............ 703/14 |
| 2005/0273738 | A1 * | 12/2005 | Byrn et al. ............ 716/4 |
| 2009/0077510 | A1 * | 3/2009 | Youngman et al. ............ 716/5 |
| 2012/0150473 | A1 * | 6/2012 | Grise et al. ............ 702/117 |
| 2012/0194236 | A1 * | 8/2012 | Ficke et al. ............ 327/156 |

OTHER PUBLICATIONS

Big FPGA Boards High Performance Computing; DINI Group; http://www.dinigroup.com/new/DN7406k1OPCle-8T.php[Jun. 7, 2012 12:43:20 PM].

Altera FPGA Clocks Analog TI.com http://www.ti.com/ww/en/Altera/pg_clocks.html.

Denneau, "The Yorktown Simulation Engine," 19th Design Automation Conference Proceedings, Paper 7.2, Jun. 14-16, 1982, pp. 55-59.

Abramovici, et al., "A Logic Simulation Machine," 19th Design Automation Conference Proceedings, Paper 7.4, Jun. 14-16, 1982, pp. 65-73.

Koike, "HAL: A High-Speed Logic Simulation Machine," IEEE Design & Test, Oct. 1985, 61-73.

Beresford, "Hard Facts, Soft ASIC's," VLSI Systems Design, Dec. 1986, pp. 8.

Beresford, "An Emulator for CMOS ASICs," VLSI Systems Design, May 4, 1987, pp. 8.

Agrawal, et al., "Mars: A Multiprocessor-Based Programmable Accelerator," IEEE Design & Test of Computers, Oct. 1987, pp. 28-36.

Beece, et al., "The IBM Engineering Verification Engine," 25th ACM/IEEE Design Automation Conference, Jun. 12-15, 1988, Paper 17.1, pp. 218-224.

Agrawal, et al., "A Hardware Logic Simulation System," IEEE Transaction on Computer-Aided Designs, vol. 9, No. 1, Jan. 1990, pp. 19-29.

Babb, "Virtual Wires: Overcoming Pin Limitations in FPGA-based Logic Emulations," Masters Thesis, MIT, Department of EEC, Nov. 15, 1993, pp. 142-151; also available as MIT/LCS Technical Report TR-586 Babb, et al.

Dahl, "An Implementation of the Virtual Wires Interconnect Scheme," Masters Thesis, MIT, Department of EEC, Jan. 26, 1994, pp. 1-52; Also available as MIT/LCS Technical Report.

Bauer, "The Design of an Efficient Hardware Subroutine Protocol for FPGAs," Masters Thesis, MIT, Department of EEC, May 16, 1994, pp. 1-55; Also available as MIT/LCS Technical Report.

Jones, "A Time-Multiplexed FPGA Architecture for Logic Emulation," Masters Thesis, University of Toronto, Department of EEC, 1995, pp. 1-103.

"Virtual Wires: Overcoming Pin Limitations in FPGA-based Logic Emulations," IEEE, 1993, pp. 142-151.

Tessier, "Virtual Wires Pictures," article from webmaster@cag.lcs.mit.edu, Feb. 3, 1995, two pages.

Babb, et al., "More Virtual Wires" article from webmaster@cag.lcs.it.edu, Feb. 3, 1995, one page.

Maliniak, "Pin Multiplexing Yields Low-Cost Logic Emulation," Electronic Design, Jan. 22, 1996, pp. 65-66.

Goering, "Emulation for the Masses," Electronic Engineering Times, Jan. 29, 1996, pp. 63.

'IKOS Systems to Acquire Virtual Machineworks, article from IKOS Systems, Inc., Mar. 11, 1996, two pages.

"Logic Emulation for the Masses Arrives," article from IKOS Systems, Inc., Mar. 26, 1997, three pages.

VHDL Mixed-Level Fault Simulator, article from IKOS Systems, Inc., Mar. 26, 1997, seven pages.

"VirtuaLogic SLI," article from IKOS Systems, Inc., Mar. 26, 1997, four pages.

Payne, Automated Partitioning of Hierarchically Specified Digital Systems, May 1981, pp. 1-132.

* cited by examiner

GENERATING USER CLOCKS FOR A PROTOTYPING ENVIRONMENT

FIELD

The present patent document relates generally to functional verification systems for circuit designs. In particular, the present patent document relates to a method and apparatus for generating user clocks for a circuit design under test in a prototyping board.

BACKGROUND

Designers of integrated circuit devices ("chips"), generally application-specific integrated circuits ("ASIC"), may use prototyping as part of the electronic design automation process prior to manufacture of the chip by a foundry. Prototyping is one type of hardware-based functional verification that allows the circuit designer can observe the behavior of the circuit design under conditions approximating its final, manufactured performance. During prototyping, a circuit design, generally written in register transfer language ("RTL") code, is programmed into one or more programmable logic chips, frequently field-programmable gate arrays ("FPGA") on a prototyping board. FPGA-based prototypes are a fully functional representation of the circuit design, its circuit board, and its input/output ("I/O") devices. Also, FPGA prototypes generally run at speeds much closer to the clock speed at which the manufactured chip will run than other types of functional verification, making them much more accurate. The circuit design prototype may also be inserted into another electronic circuit so that the circuit design prototype may be observed and tested in an environment in which the manufactured chip will be used. As such, circuit designers may use FPGA prototyping as a vehicle for software co-development and validation, increasing the speed and accuracy of system developments.

Prototyping of a circuit design using programmable logic chips presents several advantages over other types of functional verification, namely emulation using a plurality of emulation processors. First, prototyping using programmable logic chips generally results in higher performance and speed relative to emulation. Second, such higher-speed circuit design prototypes can sometimes even run in real-time, that is, the prototype may run at the intended clock speed of the manufactured chip, rather than a reduced clock speed. This is not always the case, notably for higher performance circuit designs that have clock speeds higher than the maximum allowed by the programmable logic chips. Third, such circuit design prototypes are generally of lower cost than an emulation system using processors.

Exemplary hardware used in prototyping comprises FPGAs or other types of programmable logic chips, input/output circuitry, and interconnect circuitry connecting the programmable logic chips to each other and to the input-output circuitry. An example of commercial prototyping hardware includes the DN7006K1 OPCIe-8T manufactured by the DINI Group of La Jolla, Calif. The DN7006K10PCIe-8T features six Altera Stratix 3 3SL340 (FF1760) FPGAs, a configuration FPGA, global clock generation hardware, interconnect connecting the FPGAs to each other, input/output devices including an eight lane PCI Express Endpoint, and DDR SODIMM slots for the insertion of RAM.

One problem frequently encountered by circuit designers during prototyping is that a FPGA often has less logical capacity than the circuit design, meaning that the number of logic gates available in the FPGA are insufficient to program in all the logic of the circuit design. This is a well-known problem resulting from the fact that the logic of an ASIC is almost always much denser than the logic of an FPGA. Thus, for all but the simplest ASICs, the current state of FPGA technology does not allow the entirety of the logic of a single ASIC to be prototyped within a single FPGA. This may be overcome by using multiple FPGAs for prototyping, where the logic of the circuit design is partitioned among multiple FPGAs. With multiple FPGAs, interconnect is required between the FPGAs for signal flow from one portion of the circuit design logic on a first FPGA to another portion of the circuit design logic on a second FPGA. This results in a requirement that a large number of signals flow between FPGAs, using many of the FPGA I/O pins. FPGAs have a limited number of pins for power, data, clocks, management, and miscellaneous other required signals. Techniques such as signal multiplexing and partitioning optimization, attempt to minimize the signal flow between FPGAs to minimize the limited number of FPGA I/O pins used.

Current FPGA prototyping designs deal with some of the problems of a limited number of FPGA I/O pins, which also limits the total number of clock lines that can be routed into and out of each FPGA. One partial solution is to use software that efficiently distributes the logic between FPGAs to minimize the number of signals flowing between FPGAs. Another way to deal with the problem is to multiplex signal pins, so that more than one signal may be carried on a single interconnect between I/O pins, freeing up yet more I/O pins for clock signals. Either technique may free up a number of I/O pins for clock lines. However, these techniques still inadequate as the number of FPGA and ASIC logic gates continue to grow in size faster than the number of available I/O pins.

Most modern chip designs have a large number of clocks because circuit designers find the use of multiple clocks to bestow certain performance advantages in their circuit designs. An exemplary clock specification is shown in Table A below. Each clock value is given in units of Megahertz (MHz).

TABLE A

| | | |
|---|---|---|
| clockFrequency -add | { CLK1 | 27.00   } |
| clockFrequency -add | { CLK2 | 27.00   } |
| clockFrequency -add | { CLK3 | 74.00   } |
| clockFrequency -add | { CLK4 | 75.00   } |
| clockFrequency -add | { CLK5 | 600.00  } |
| clockFrequency -add | { CLK6 | 241.00  } |
| clockFrequency -add | { CLK7 | 160.00  } |
| clockFrequency -add | { CLK8 | 33.00   } |

Each of the clock frequencies listed in Table A are in whole numbers of Megahertz for ease of understanding, but the clock frequencies may be, and often are, non-whole number values. For example CLK5 is indicated as 600.00, but may just as easily be 600.374 MHz. What is more, an ordinary modern circuit design may have dozens of different clocks, whereas this example has eight. In order for prototyping to be most effective, the prototype needs to match as closely as possible the functionality of the circuit design as it will be manufactured, which includes the prototype using the same number of clocks as the circuit design.

Additionally, in an ideal prototyping system, the frequencies would be the same in the prototype as they are in the circuit design prototype. However, present-day FPGAs frequently do not operate at the highest clock frequencies of the circuit design. As a result, lower clock frequencies must be used.

In most FPGA-based prototyping systems, clock signals are generated by a central clock generator that is on the prototyping board, but not part of any FPGA hosting a circuit design partition. These user clock signals are then distributed to each FPGA, often without regard to whether any of the logic of that FPGA used that particular user clock. Using this method of clock generation, there may be many user clock lines occupying a greater number of FPGA I/O pins than is desirable.

SUMMARY

A method and apparatus for generating user clocks in a prototyping system is disclosed. A first aspect of the apparatus comprises a clock generation circuit to generate a clock signal having a reference frequency, a programmable logic device in electrical communication with the clock generation circuit and receiving the clock signal having the reference frequency, and interconnect electrically connecting the programmable logic device to the clock generation circuit. The programmable logic device itself includes a reset circuit receiving the clock signal having the reference frequency and generating a reset signal, a multiplier circuit receiving the clock signal having the reference frequency, wherein the multiplier circuit multiplies the clock signal having the reference frequency by a first value to generate a clock signal having a multiplied frequency, and a divider circuit in electrical communication with the reset circuit and the multiplier circuit, receiving the reset signal from the reset circuit and receiving the clock signal having the multiplied frequency from the multiplier circuit, wherein the divider circuit divides the clock signal having the multiplied frequency by a second value to generate a clock signal having a user clock frequency.

In another aspect of the apparatus there is a second programmable logic device receiving the clock signal having the reference frequency and interconnect electrically connecting the second programmable logic device to the clock generation circuit and the first programmable logic device. The second programmable logic device includes a second multiplier circuit receiving the clock signal having the reference frequency, wherein the multiplier circuit multiplies the clock signal having the reference frequency by the first value to generate a second clock signal having the multiplied frequency, and a second divider circuit in electrical communication with the reset circuit and the second multiplier circuit, receiving the reset signal from the reset circuit and receiving the second clock signal having the multiplied frequency from the second multiplier circuit, wherein the second divider circuit divides the clock signal having the multiplied frequency by the second value to generate a second clock signal having the user clock frequency.

In another aspect of the apparatus the reference frequency received by the programmable logic device is a substantially the programmable logic device's maximum operating frequency. In another aspect of the apparatus the programmable logic devices are field-programmable gate arrays. In yet another aspect of the apparatus the multiplier circuit and the second multiplier circuits are each phase-locked loops.

A first aspect of the method comprises a computer-implemented method of producing circuits for generating user clocks in a plurality of programmable logic devices of a prototyping system, comprising extracting a user clock from a circuit design, wherein the user clock has a user clock frequency, partitioning the circuit design for programming into a plurality of programmable logic devices, selecting a reference clock frequency and a scaled user clock frequency, implementing a first multiplier circuit and a first divider circuit to generate a first scaled user clock having the scaled user clock frequency from a reference clock having the reference clock frequency, implementing a second multiplier circuit and a second divider circuit to generate a second scaled user clock having the scaled user clock frequency from the reference clock having the reference clock frequency, and implementing a reset circuit to receive the clock signal having the reference clock frequency, and to transmit a reset signal to reset the first divider circuit and the second divider circuit.

In another aspect of the method the reference clock frequency is substantially a maximum clock frequency of the programmable logic device. In another aspect the plurality of programmable logic devices comprise a plurality of field-programmable gate arrays. In yet another aspect of the method the first multiplier circuit comprises a first phase locked-loop, and the second multiplier circuit comprises a second phase locked-loop.

Another aspect of the apparatus comprises a computer-readable non-transitory storage medium having stored thereon a plurality of instructions. The plurality of instructions, when executed by a computer, cause the computer to perform extracting a user clock from a circuit design, wherein the user clock has a user clock frequency, partitioning the circuit design for programming into a plurality of programmable logic devices, selecting a reference clock frequency and a scaled user clock frequency, implementing a first multiplier circuit and a first divider circuit to generate a first scaled user clock having the scaled user clock frequency from a reference clock having the reference clock frequency, implementing a second multiplier circuit and a second divider circuit to generate a second scaled user clock having the scaled user clock frequency from the reference clock having the reference clock frequency, and implementing a reset circuit to receive the clock signal having the reference clock frequency, and to transmit a reset signal to reset the first divider circuit and the second divider circuit.

In another aspect of apparatus the reference clock frequency is substantially a maximum clock frequency of the programmable logic device. In another aspect of the apparatus the plurality of programmable logic devices comprise a plurality of field-programmable gate arrays. In yet another aspect of the apparatus the first and second multiplier circuits comprise phase locked-loops.

Another aspect of the method the prototyping system comprises a plurality of prototyping resources, including a plurality of programmable logic devices, wherein the programmable logic devices are programmed with a portion of a circuit design, and wherein interconnect connects each programmable logic device to at least one other programmable logic device, the method comprising extracting a first user clock frequency and a second user clock frequency from the circuit design, selecting a reference clock frequency for a reference clock signal, programming a reset circuit into a first programmable logic device, wherein the reset circuit generates a reset signal, programming a first multiplier circuit into the first programmable logic device, wherein the multiplier circuit receives the reference clock signal having the reference clock frequency, multiplies the reference clock frequency by a first multiply-by value, and outputs a clock signal having a first multiplied clock frequency, programming a first divider circuit into the first programmable logic device, wherein the first divider circuit divides the clock signal having the first multiplied clock frequency by a first divide-by value, and wherein the first divider circuit outputs a clock signal having the first user clock frequency in response to the reset signal, programming a second multiplier circuit into a second programmable logic device, wherein the multiplier circuit receives the reference clock signal having the reference clock frequency, multiplies the reference clock frequency by a second multiply-by value, and outputs a clock signal having a second multiplied clock frequency, and programming a second divider circuit into the second programmable logic device, wherein the second divider circuit divides the clock signal having the second multiplied clock frequency by a second divide-by value, and wherein the second divider circuit outputs a clock signal having the second user clock frequency in response to the reset signal.

In another aspect of the method the reference clock frequency is substantially a maximum clock frequency of the programmable logic device. In another aspect of the method the plurality of programmable logic devices comprise a plurality of field-programmable gate arrays. In yet another aspect of the method the first multiplier circuit comprises a first phase locked-loop, and the second multiplier circuit comprises a second phase locked-loop.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles of the present invention.

Figure 1:
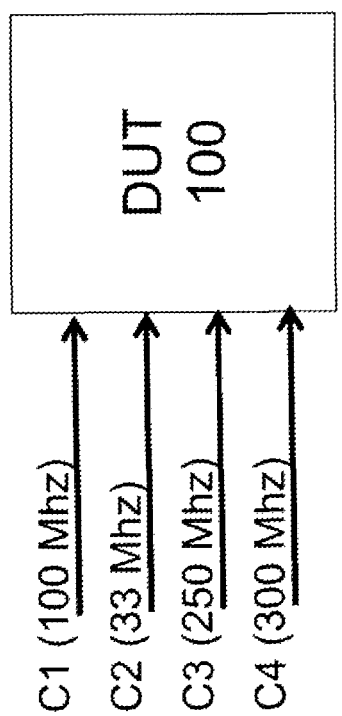
FIG. 1 is an illustration of a circuit design under test receiving four clock signals.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for generating user clocks in a prototyping system is disclosed.

Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

In an embodiment, it is recognized that it is more desirable to generate user clocks needed by circuit design logic within each FPGA from a single reference clock or a small number of reference clocks. This requires fewer FPGA I/O pins dedicated to clock signals. Most modern FPGAs have built-in phase-locked loops ("PLL"). With a clock input of a particular frequency, a PLL may be used to generate a user clock of a higher frequency within an FPGA from a received reference clock signal. This generated user clock will have a frequency that is a multiple "n" of the reference clock, wherein "n" represents a whole number. Because of its design, the user clock generated in a PLL is in-phase with the reference clock signal. More than one user clock signal of a higher frequency may also be generated, each in-phase with the reference clock signal received by the PLL. However, in order to generate user clock signals of a lower frequency, divider circuit must be used. Such FPGA divider circuit is well-known and may comprise latches and/or combinational logic to effectuate divide-by-m functionality, wherein "m" represents a whole number. The divider circuit may reduce the frequency of a reference clock by some divisor of the reference clock signal's frequency. Notably, in order to generate user clocks that are fractions of the reference clock—such fractions being both greater than and less than unity—both PLLs and divider circuit may be employed. Unlike a PLL, such divider circuit does not inherently maintain the in-phase relationship between the generated user clock and the reference clock.

FIG. 1 illustrates the clock signals used by the logic of DUT 100 in an embodiment. DUT 100 represents an arbitrary circuit design under test ("DUT") having four different input clock signals C-1 to C-4. For example DUT 100 could be for a controller, a graphics processing unit, or a network interface device using four different clock signals. The DUT may be written in any language suitable for programming into an FPGA, or suitable for conversion to such language, include For prototyping, the four clock signals need to be generated and applied to the logic of DUT 100, clock signal C1 having a frequency of 100 Mhz, C2 having a frequency of 33 Mhz, C3 having a frequency of 250 Mhz, and C4 having a frequency of 300 Mhz.

Figure 2:
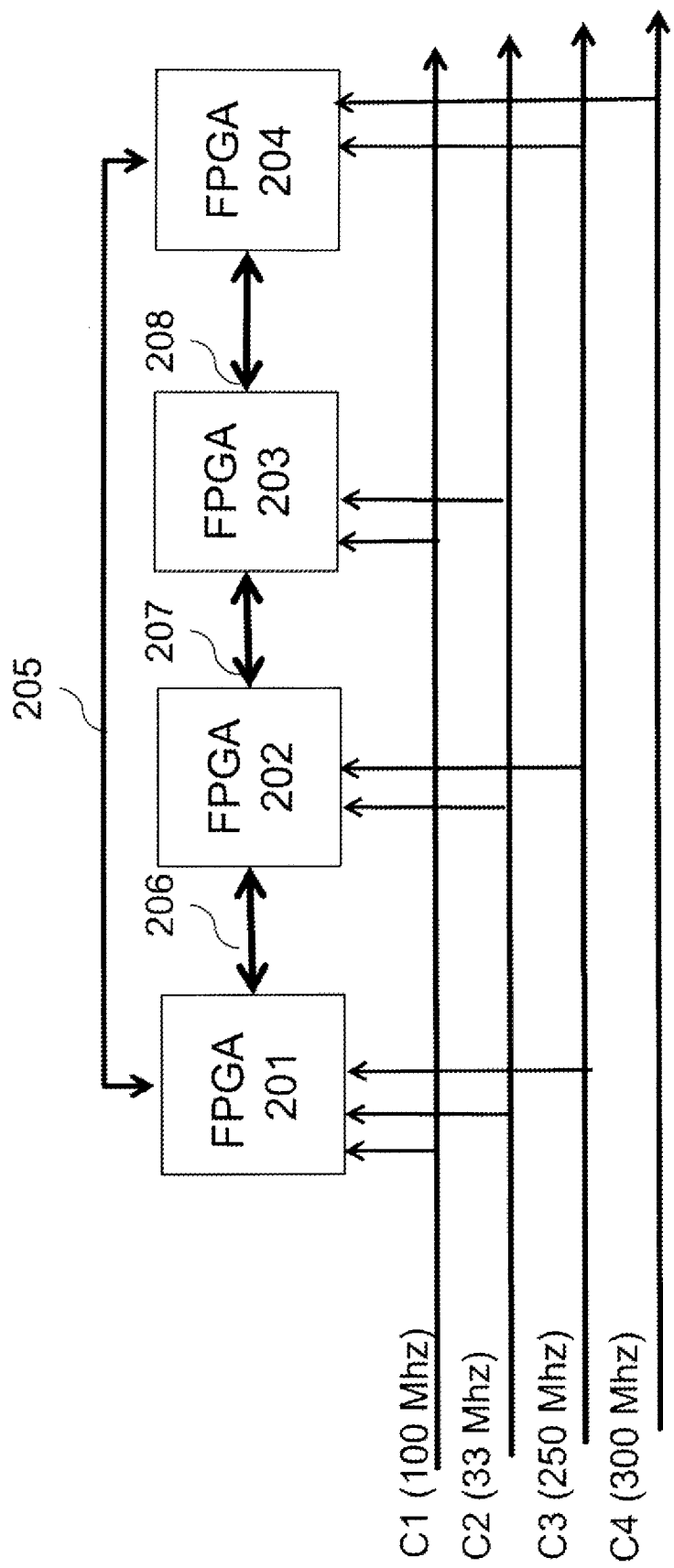
FIG. 2 is an illustration of a partitioned circuit design under test receiving four clock signals.

FIG. 2 illustrates the case wherein DUT 100 illustrated in FIG. 1 has been partitioned into four blocks of circuitry, each block programmed into one of FPGAs 201-204. FPGAs 201-204 are part of a prototyping system comprising a circuit board that hosts FPGAs, clock generation circuits, interconnect lines connecting the FPGAs to each other, clock generation circuitry, I/O devices for communication to external hardware, connectors, and memory.

The programmable logic devices used in this embodiment are FPGAs. As will be appreciated by one of skill in the art, any number of programmable logic devices suitable for prototyping may be used in place of the FPGAs of this embodiment.

Partitioning of circuit design DUT 100 may be accomplished using any number of partitioning techniques well-known to those in the field of prototyping. Each of FPGAs 201-204 may host additional circuitry for management, control, and testing functionality. Signal interconnect 206 connects FPGA 201 to FPGA 202 for the transmission and receipt of signals to and from FPGAs 201 and 202. Such interconnect include conductors routed on the prototype circuit board hosting the FPGAs. Likewise, interconnect 207 connects FPGA 202 to FPGA 203, interconnect 208 connects FPGA 203 to FPGA 204, and interconnect 205 connects FPGA 204 to FPGA 201.

After the partition of DUT 100, each of the interconnected FPGAs 201-204 may require fewer than all the clock signals C1-C4. Each FPGA hosts a set of logic using a particular clock signal, known as a clock domain. In this embodiment, FPGA 201 requires clock signals C1, C2, and C3 because FPGA 201 hosts clock domains requiring clock signals C1, C2, and C3, but not C4. Likewise, FPGA 202 requires clock signals C2 and C3, FPGA 203 requires clock signals C1 and C2, and FPGA 204 requires clock signals C3 and C4. In order to maintain a constant phase relationship between each of the FPGAs 201-204, the clock signal lines carrying clock signals C1-C4 will have to be low-skew, meaning that the clock signal lines must be carefully designed so that during clock distribution, each of the clock signals maintains their phase relationship between each of FPGAs 201-204. This is difficult in practice. Furthermore, while only four total clock lines are used the embodiment illustrates in FIG. 2, when several dozen clock lines are used, as is the case in many circuit designs, there will result an even more difficult clock distribution problem.

Figure 3:
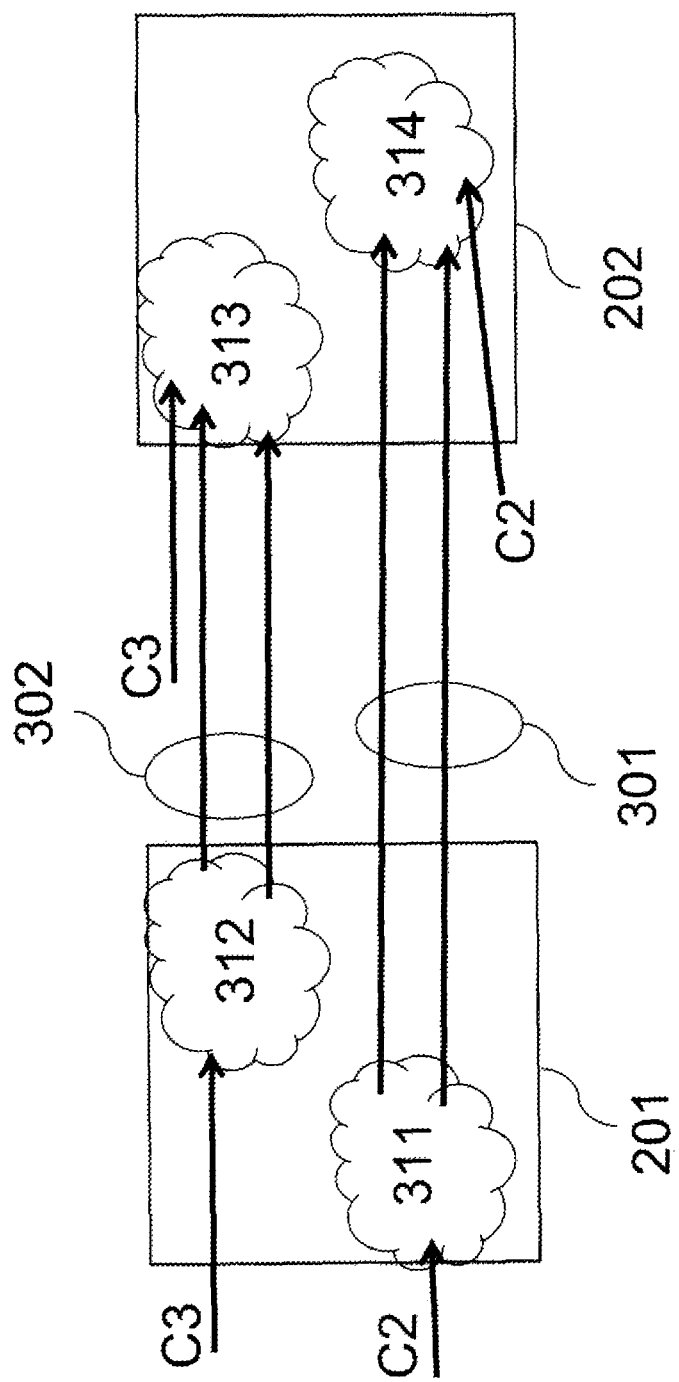
FIG. 3 is an illustration of exemplary clock and data signals transmitted between clock domains of FPGA partitions.

FIG. 3 illustrates clock and data signals travelling between the partitions of FPGAs 201 and 202 to illustrate the importance of clock synchronization. Shown in FIG. 3 are two clock domains of FPGA 201, clock domain 311 using clock signal C2 and clock domain 312 using clock signal C3. Two clock domains of FPGA 202 are clock domain 314 using clock signal C2 and clock domain 313 using clock signal C3. A plurality of signals 301 are driven by clock signal C2 between clock domain 311 of FPGA 201 and clock domain 314 of FPGA 202. Likewise, signals 302 are driven from clock domain 312 to clock domain 313. Signals 301 and 302 are transmitted via interconnect 206 on the circuit board housing the FPGAs. As with all interconnect, there is a finite delay associated with the transmission, such delay being much greater for signals transmitted between logic over the interconnect between two FPGAs than for signals transmitted between logic within a single FPGA. In order to avoid a race condition or other error between clock C2 of FPGA 202 and the arriving signals 301, clock signal C2 that drives FPGA 201 and clock signal C2 that drives FPGA 202 need to be in phase between FPGAs 201 and 202. For the same reason, clock signal C3 that drives FPGA 201 and clock signal C3 that drives FPGA 202 need to be in phase.

Figure 4:
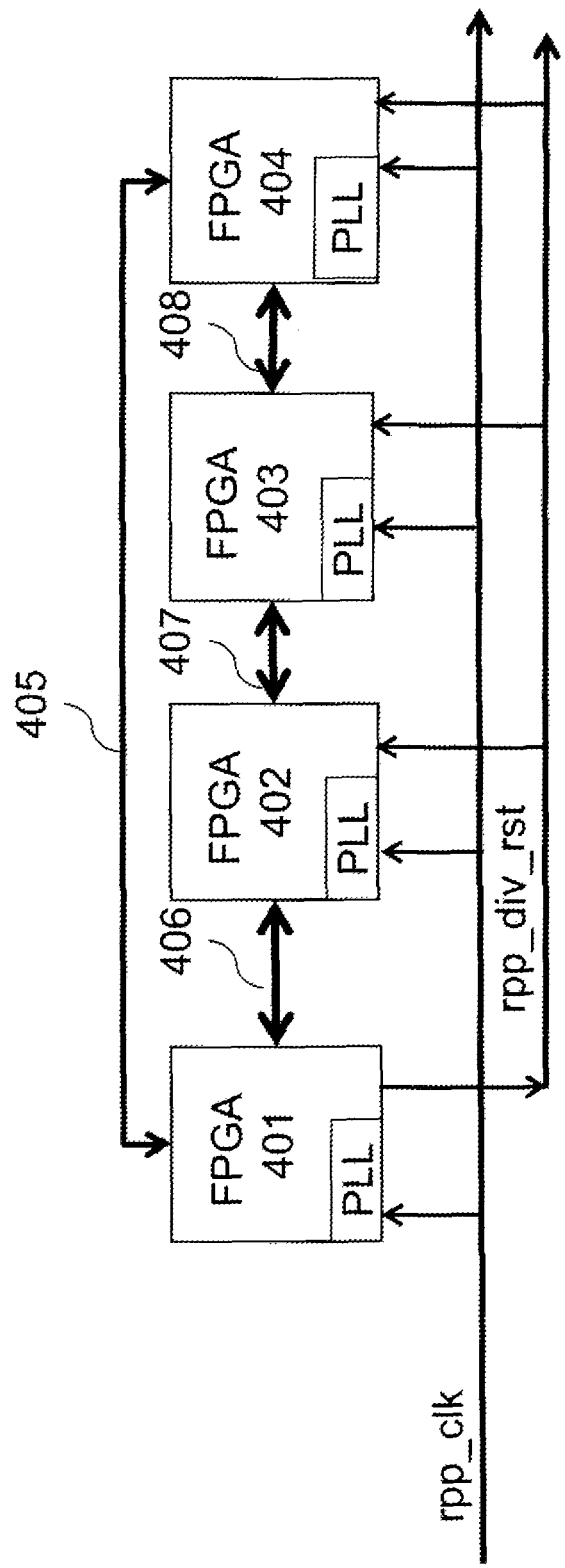
FIG. 4 is an illustration of clock and reset signal distribution between FPGA partitions.

FIG. 4 illustrates an embodiment wherein the DUT has been partitioned into four FPGAs 401-404, and wherein each FPGA 401-404 has at least one PLL. The user clock frequencies of the DUT for this embodiment are the same illustrated in FIG. 2: C1 is 100 Mhz, C2 is 33 Mhz, C3 is 250 Mhz, and C4 is 300 Mhz. Added to the difficulty of clock generation and distribution, an FPGA is often limited to a particular maximum clock speed. For the FPGAs 401-404 of this embodiment, the FPGA is limited to a maximum operating frequency of 100 Mhz. Since both clocks C3 and C4 exceed the maximum operating frequency of the FPGAs 401-404, each of the clock signals C1-C4 must be scaled down such that the DUT prototype clocks operate at or less than one-third the frequency of the circuit design clocks as they will operate in the manufactured chip. This will decrease speed performance of the prototype, but will maintain the ratio between the user clocks, resulting in a substantially accurate prototype. This down-scaling generates scaled user clocks: user_clk1 at 33.3 Mhz, user_clk2 at 11 Mhz, user_clk3 at 83.3 Mhz, and user_clk4 at 100 Mhz, corresponding to user clocks C1, C2, C3, and C4 respectively. As a result, one value for the input reference clock signal rpp_clk is 11 Mhz. Other values for the input clock signal may also be chosen, and other values of the input reference clock signal may be more or less desirable in order to optimize the number and complexity of multiplier circuit, including PLLs, and divider circuit. Here, 11 MHz an option, but a circuit designer may find other frequencies to be advantageous as well. From the reference clock having a greater frequency, lower frequency clocks may be obtained by using divider circuit. Such divider circuit in an FPGA is well-known and may comprise latches and/or combinational logic.

Unlike each PLL of FPGAs 401-404, the divider circuit does not maintain the phase relationship between the clock signals. As a result, a reset signal to the divider circuit of each FPGA to maintain the phase relationship of the scaled user clocks. This reset signal is applied across each FPGA in common. In this embodiment, reset circuitry is implemented in FPGA 401. It is only necessary that one FPGA among the FPGAs of the DUT prototype implement reset circuitry, which transmits a common reset signal rpp_div_rst received by FPGAs 402-404. The only requirement on the reset circuitry is that it is synchronized with the input reference clock rpp_clk so that the scaled user clocks generated in each of the FPGAs are not out of phase.

In an alternative embodiment the DUT has also been partitioned into four FPGAs, where each FPGA has at least one PLL. The user clock frequencies for this embodiment are as follows: C1 is 25 Mhz, C2 is 33 Mhz, C3 is 300 Mhz, and C4 is 600 Mhz. As before, the FPGAs 401-404 of this embodiment are limited to a maximum operating frequency of 100 Mhz. Since both clocks C3 and C4 exceed the maximum operating frequency of the FPGAs 401-404, each of the clock signals C1-C4 must be scaled down such that the DUT prototype clocks operate at or less than one-sixth the frequency of the circuit design clocks as they will operate in the manufactured chip. This down-scaling results in scaled user clocks such that user_clk1 is 4.17 Mhz, user_clk2 is 5.5 Mhz, user_clk3 is 50 Mhz, and user_clk4 is 100 Mhz. This means that one value for the input reference clock signal rpp_clk could be 4.17 Mhz. However, in addition to maximum operating frequency for the FPGAs 401-404, the PLLs of this embodiment have a minimum operating frequency. A PLL minimum operating frequency is common for FPGAs, including an FPGA manufactured by Altera Corporation, but the minimum value itself varies between models and manufacturers. The required minimum frequency for a PLL of a FPGA may differ among types of FPGAs, but if it is greater than 4.17 Mhz, then the input reference clock signal rpp_clk needs to have some value greater than 4.17 Mhz in order for the PLL to multiply the frequency. In this embodiment, the reference clock signal is chosen to be 8.33 Mhz. From the larger reference clock value, lower frequency clocks may be obtained by using divider circuits.

Figure 5A:
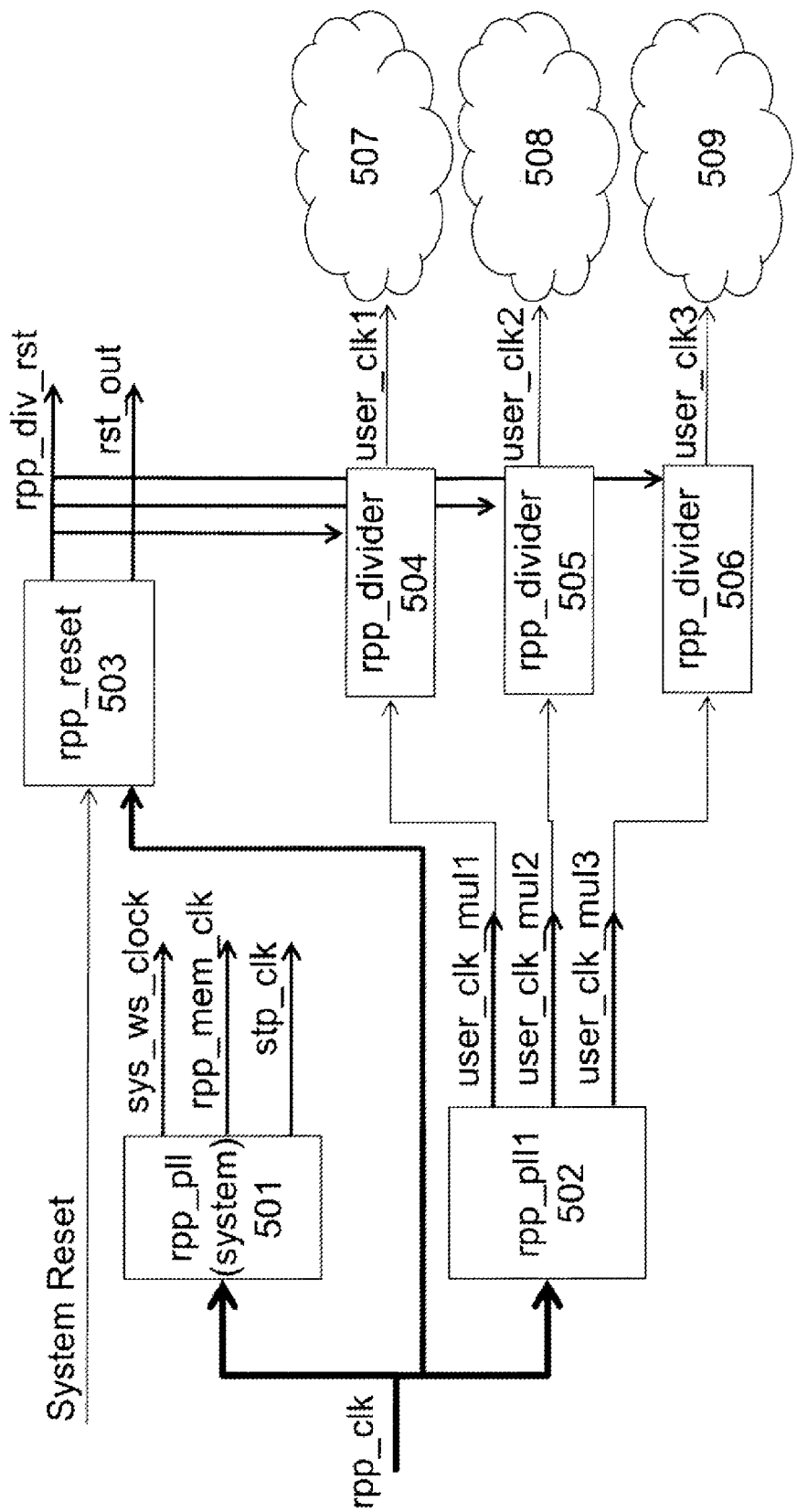
FIGS. 5A and 5B are illustrations of circuits for generating user clocks and reset signals programmed into FPGAs of a prototyping system.

FIG. 5A shows a portion of the embodiment illustrated in FIG. 4 wherein C1 is 100 Mhz, C2 is 33 Mhz, C3 is 250 Mhz, and C4 is 300 Mhz in further detail, specifically the logic inserted into FPGA 401 to generate user clocks for FPGA 401. FPGA 401 is configured to receive a reference clock signal and a system reset signal transmitted via interconnect and received at an I/O pin of the FPGA. The reference clock signal is rpp_clk. As discussed above, this signal has the value of 11 Mhz in this embodiment. The frequency of reference clock signal rpp_clk may need to vary depending on the frequencies of the user clocks in the circuit design, the amount of any scaling of the user clocks to operate within the operating range of the FPGA, and the minimum operating frequency of the PLLs of the FPGAs of the prototyping platform.

Clock generation circuitry of the prototype system hosting FPGAs 401-404 transmits reference clock signal rpp_clk using the interconnect of the circuit board for receipt by PLL rpp_pll1 502. Each of FPGAs 401-404 receive this signal. This clock is a programmable reference clock, meaning that the frequency of reference clock signal rpp_clk may be chosen to be any number of values under program control. The interconnect used for transmission of reference clock signal rpp_clk to FPGAs 401-404 should be a low-skew line so that each of FPGAs 401-404 receive reference clock signal rpp_clk, without rpp_clk becoming out of phase.

PLL rpp_pll1 502 implements multiply functionality, increasing the frequency of the reference clock signal rpp_clk by a certain value selected for each user clock to be generated. As a result, multiplied user clocks are generated in FPGA 401. These multiplied user clocks—in FIG. 5A there are three shown: user_clk_mul1, user_clk_mul2, and user_clk_mul3—are transmitted to divider circuit also implemented in FPGA 401. Thus, the first multiplied user clock user_clk_mul1 generated by rpp_pll1 502 is received by divider circuit rpp_divider 504. Divider circuit rpp_divider 504 may be any suitable synchronous frequency divider that can be implemented in an FPGA. Divider circuit rpp_divider 504 then divides the frequency of user_clk_mul1 by a previously selected value, resulting in user_clk1, which is a user clock having the desired frequency. This generated user clock user_clk1 is then transmitted to the logic of FPGA 401 that are in the user clock's respective clock domain 507. In a similar fashion, user_clk_mul2 generated by rpp_pll1 502 is received by rpp_divider 505 that divides this multiplied user clock by a previously selected value, resulting user_clk2 having the desired user clock frequency and transmitted to the logic of FPGA 401 that are in the user clock's respective clock domain 508. Finally, in the same way user_clk_mul3 generated by rpp_pll1 502 is received by rpp_divider 506 that divides this multiplied user clock by a previously selected value, resulting user_clk3 having the desired frequency and transmitted to the logic of its respective clock domain 509.

In this embodiment, PLL rpp_pll1 502 is a single PLL with multiple outputs implementing multiply functionality. However, multiple PLLs may be used in FPGA 401 to multiply the frequency of the reference clock rpp_clk. Even if several PLL instances are used, the phase relationship of the multiplied user clocks, user_clk_mul1, user_clk_mul2, and user_clk_mul3, will be maintained because each PLL will maintain the phase of the input relative to the output. Likewise, the phase relationships of the multiplied user clocks in the other FPGAs, FPGAs 402-404, will be maintained relative to FPGA 401.

FPGA 401, in addition to the multiplier and divider circuits, comprises reset circuitry rpp_reset 503. This reset circuitry receives both the reference clock rpp_clk and a "System Reset" signal. The System Reset signal initiates a user reset of each of the FPGAs 401-404 by triggering the reset circuitry rpp_reset 503 to generate a reset control signal rst_out that is transmitted to each of FPGAs 401-404 from FPGA 401. The reset circuitry rpp_reset 503 generates a reset signal rpp_div_rst, in phase with the reference clock signal rpp_clk, that is transmitted to each of the divider circuits rpp_divider 504, rpp_divider 505, and rpp_divider 506 of FPGA 401. This reset signal synchronizes the transmission of user clock signals from the divider circuits such that the user clocks are in phase with each other across FPGAs 401-404. Reset signal rpp_div_rst is transmitted from FPGA 401 to each of FPGA 402, 403, and 404, and received by their respective divider circuits, thus synchronizing each of the user clocks output from the divider circuits of the various FPGAs of the prototyping system, as further detailed in FIG. 5B.

Figure 5B:
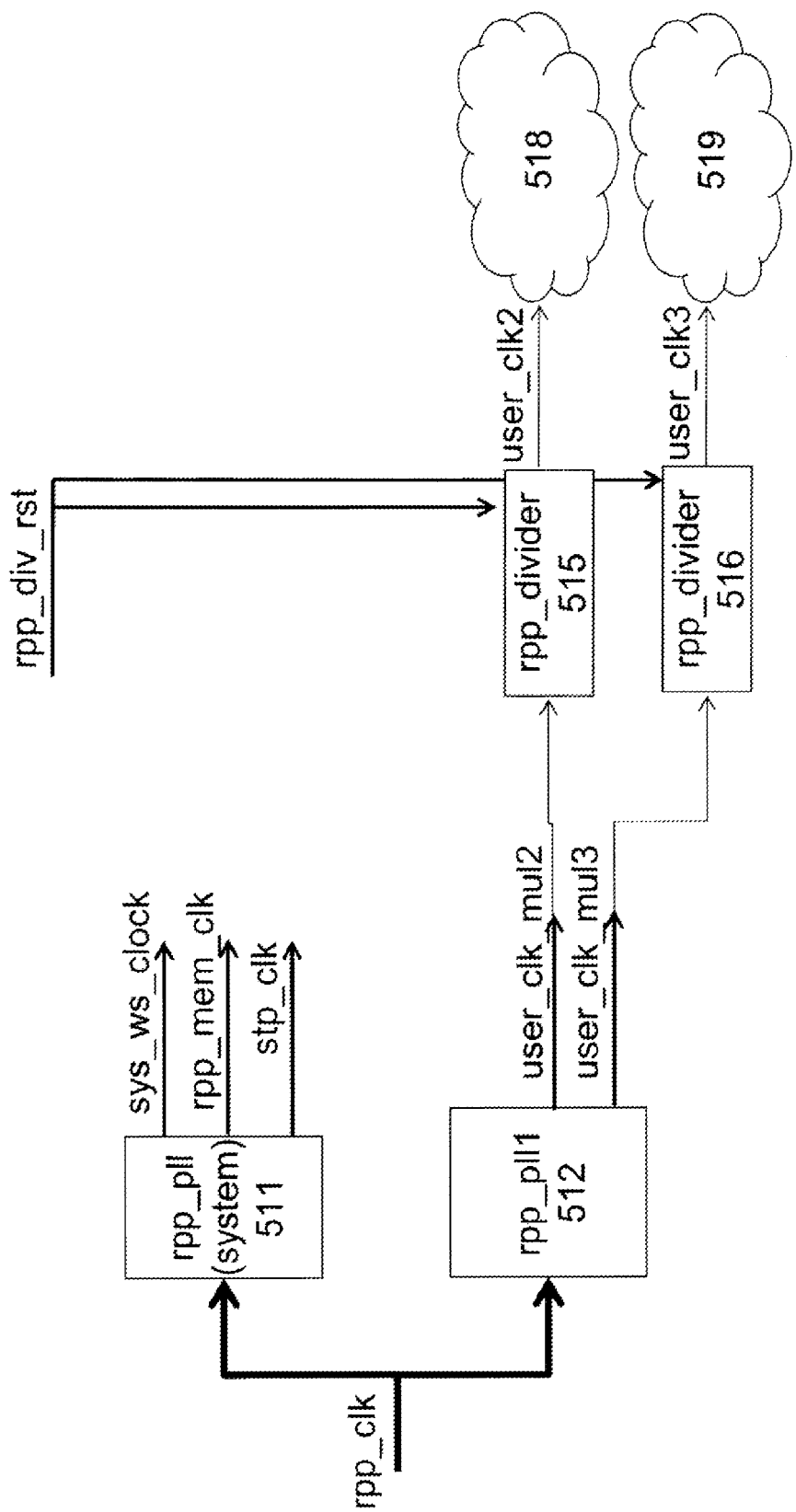

FIG. 5B illustrates logic programmed into FPGA 402 for generating the user clocks local to FPGA 402, user_clk2 and user_clk3. Within FPGA 402, PLL rpp_pll1 512 receives reference clock rpp_clk, in this embodiment having a value of 11 Mhz, and implements multiply functionality. This increases the frequency of the reference clock signal rpp_clk by a particular value selected for each user clock to be generated, separately generating multiplied user clocks user_clk_mul2 and user_clk_mul3. These multiplied user clocks, are transmitted to divider circuits that are also implemented in FPGA 402. The first multiplied user clock user_clk_mul2 is received by divider circuit rpp_divider 515. Divider circuit rpp_divider 515 then divides the frequency of user_clk_mul2 by a previously selected value, resulting in user_clk2, which is a user clock having the desired scaled user clock frequency. This scaled user clock user_clk2 is then transmitted to the respective logic of FPGA 402 that are in its clock domain 518. In a similar fashion, user_clk_mul3 is received by rpp_divider 516 that divides this multiplied user clock by a previously selected value, resulting in user_clk3 having the desired scaled user clock frequency. This user clock is then transmitted to its respective clock domain 519.

Note that the reset circuitry rpp_reset 503 of FIG. 5A for FPGA 401 is absent from the user clock generation circuitry of FPGA 402, as illustrated in FIG. 5B, because it is only necessary that one FPGA, in this case FPGA 401, generates the divider reset signal rpp_div_rst used by each of FPGAs 401-404. The reset signal rpp_div_rst is received by FPGA 402 in phase with the reference clock signal rpp_clk that is transmitted to each of the divider circuits rpp_divider 515 and rpp_divider 516 of FPGA 402. This common reset signal synchronizes the transmission of user clock signals across the FPGAs 401-404. So, user_clk2 of FPGA 401 shown in FIG. 5A is in phase with user_clk2 of FPGA 402 shown in FIG. 5B. Likewise, user_clk3 of FPGA 401 shown in FIG. 5A is in phase with user_clk3 of FPGA 402 shown in FIG. 5B. The common reset signal is likewise received and used by the divider circuits of each of the FPGAs such that each of the scaled user clocks user_clk1, user_clk2, user_clk3, and user_clk4 are in phase across each of FPGAs 401-404 where such user clocks are generated.

Figure 6:
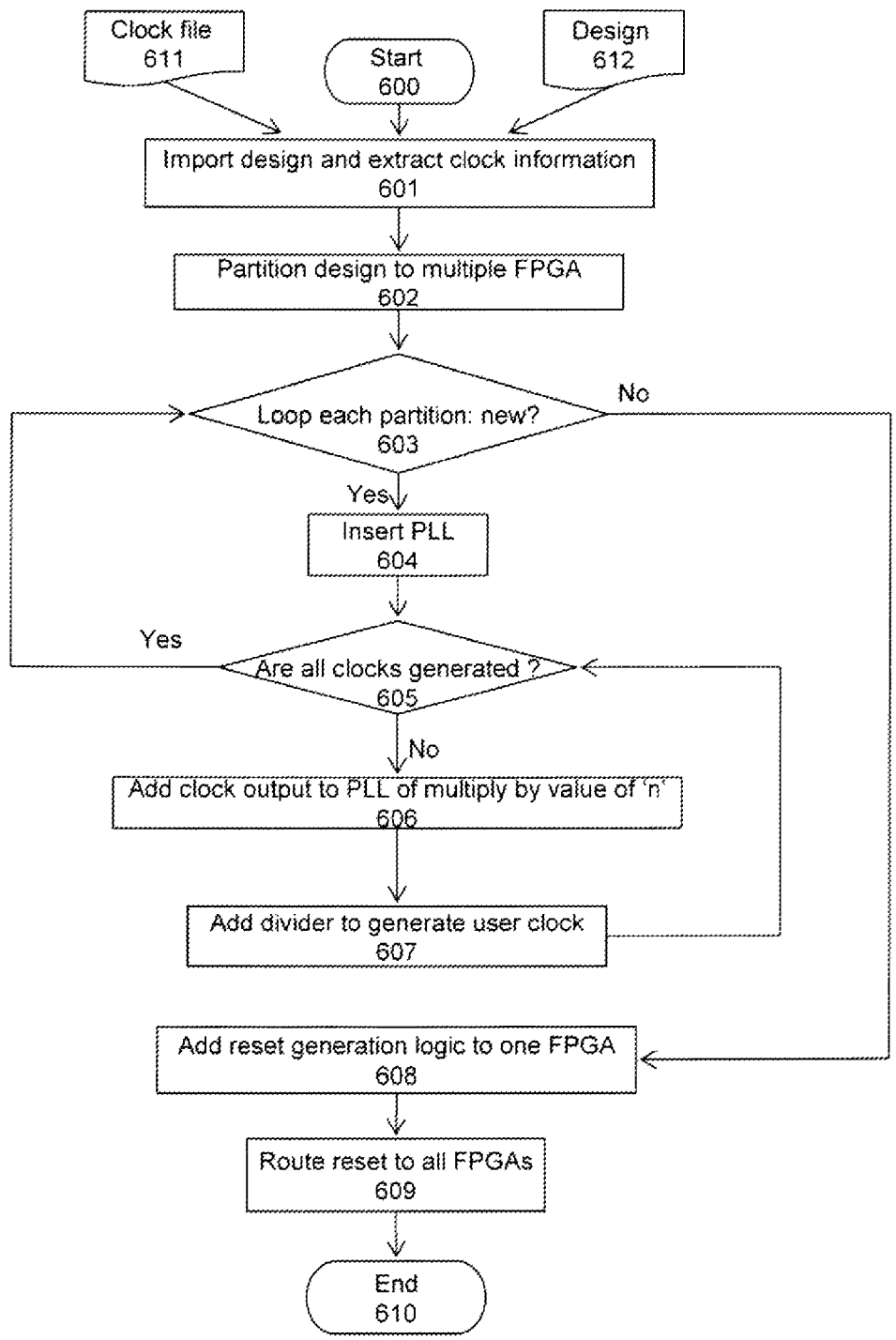
FIG. 6 illustrates an exemplary flow for creating user clock generation circuitry in FPGAs of a prototyping system.

FIG. 6 illustrates a software flow chart of an embodiment for creating circuitry to be programmed into one or more FPGAs to generate user clocks for each of the FPGAs, where the circuitry is programmed into the FPGAs along with each partition of a circuit design under test. This software is run on a workstation, comprising a general purpose processor, RAM, hard-disk or other permanent storage, and input/output devices in electrical communication with a prototyping board comprising FPGAs or other programmable logic chips, input/output circuitry, and interconnect circuitry connecting the programmable logic chips to each other and to the input-output circuitry. A clock file 611 and a circuit design file 612 are inputs to the software program. Design file 612 is the user-created circuit design to be prototyped. This design file may be in any format suitable for partitioning and programming into programmable logic chips of a prototyping system, for example HDL format. Clock file 611 specifies each of the clocks used the in the circuit design to be prototyped (the "user clocks"), including the names of the clock signals and their respective frequencies. At step 601, the circuit design is imported and the clock information is extracted by parsing the clock file 611 for each clock value. The maximum value clock frequency is determined and is selected as the reference clock rpp_clk to each of the FPGAs. It is possible to use a clock having another frequency, instead of the maximum clock frequency, for the reference clock input to the FPGAs. Suck clock frequency is user-selected, taking into account the minimum and maximum operating frequencies of the FPGA and certain components of the FPGA, for example the minimum operating frequency of the PLLs, and for example the maximum operating frequency of the FPGA. In this embodiment the maximum operating frequency of the FPGA is used for the reference clock rpp_clk. Hierarchical nets are also supported during the extraction process. During the next step, partition step 602, the circuit design is partitioned into one or more partitions, each partition to be programmed into a distinct FPGA of the prototyping board. As previously discussed, partitioning may be accomplished using any number of techniques well known in the field of prototyping that divide up the logic of the circuit design for programming into a plurality of FPGAs. However, if the circuit design is sufficiently small, the partition size may be one, corresponding to a single FPGA.

After partition, the software begins the loop containing steps 603-607 that generates the PLLs, multiplier circuit, and divider circuit to be programmed into each FPGA hosting a partition. At decision 603, if each FPGA to be programmed with a partition has already had the circuitry from the loop generated, then the software proceeds to step 608. If not every FPGA to be programmed with a partition has already had the circuitry from the loop (steps 604-607) generated, which should be the case the first time decision 603 is encountered by the software, the software proceeds to create a PLL to insert into the first FPGA at step 604. Moving to step 605, a sub-loop begins at decision 605, which sub-loop is for generating, for each of the user clocks, multiplier and divider circuits to be programmed into each FPGA hosting a partition. Decision 605 queries whether steps 606 and 607 have been performed by the software for all user clocks of the first FPGA. If "yes," then the software program returns to decision 603. If "no," which should be the case the first time that decision 605 is encountered by the software, then the software proceeds to step 606. At step 606, a multiply by number "n" is calculated for a first user clock to be generated in the FPGA, wherein "n" represents a whole number. A clock output is then added to the output of the PLL to be programmed into the first FPGA, which clock output will effectuate multiplication of the frequency of the reference clock input signal by "n." At step 607, a divide by number "m" is calculated for a first user clock to be generated in the FPGA, wherein "m" represents a whole number. Divider circuit is generated which will be programmed into the first FPGA to effectuate division of the multiplied reference clock signal, resulting in the first user clock. Such divider circuit is well-known and may comprise latches and/or combinational logic. Once the PLL is modified and the divider circuit is added, the software returns to decision 605. The sub-loop containing decision 605 and steps 606 and 607 is repeated for each user clock of the first FPGA. When all the user clocks of the first FPGA have been generated, the software returns to decision 603. From decision 603, the software proceeds to step 604 in the loop for a second FPGA containing a second partition, if such FPGA and partition are present. Once the software has added circuitry for the creation of the user clocks of each FPGA in the loop comprising decision 603 and step 604, and sub-loop comprising decision 605 and steps 606 and 607, the software proceeds to step 608.

In step 608 the software selects an FPGA in the prototyping system to be programmed with the reset generation logic, and creates such reset signal generation logic. The reset generation logic is designed to generate a reset signal that operates in phase with the reference clock signal. In step 609 the software routes, using low skew lines, the reset signal that is output from the reset generation logic to each of the FPGAs of the prototyping system. The low skew lines are intended to maintain the phase of the reset signal such that the reset signals—all from the one FPGA having the reset circuitry—as received at the various FPGAs are not out of phase upon arrival at their respective destination FPGAs. Specifically, the reset signal is received at a pin of each FPGA and distributed within the FPGA to each divider circuit of the FPGA used to generate user clocks. Once the reset signal is routed to each of the FPGAs in step 609, the software has completed its task and the user clock generation circuitry is ready to program into each of the FPGAs of the prototyping system.

While the calculation of "n" and the calculation of "m" for a user clock of an FPGA are performed in the above embodiment during steps 606 and 607 respectively, it is sufficient that "n" and "m" for a user clock of an FPGA are calculated at any point prior to their use in steps 606 and 607.

In an alternative embodiment, all values of "n" and "m" are calculated during the extraction step 601. In this alternative embodiment, at step 606 the PLL of the first FPGA is modified to effectuate multiplication of the reference clock input signal using the previously-calculated value of "n" for that user clock in that FPGA. Then, at step 607, divider circuit is added to the FPGA to effectuate division of the multiplied reference clock input signal using the previously-calculated value of "m" for that user clock in that FPGA, resulting in the first user clock. As before, once the PLL is modified and the divider circuit is implemented, the software returns to decision 605 to repeat the sub-loop as applicable for each user clock in that FPGA. Once each user clock of that FPGA is implemented, the software returns to decision 603 to generate the PLL to be inserted in the next FPGA, if a second FPGA exists.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. An apparatus for generating a user clock in a prototyping system, comprising:
a clock generation circuit to generate a clock signal having a reference frequency;
a plurality of programmable logic devices, wherein a first of the programmable logic devices is electrically connected to the clock generation circuit to receive the clock signal having the reference frequency from the clock generation circuit, comprising:
a reset circuit to receive the clock signal having the reference frequency and to generate a reset signal to synchronize a frequency of the user clock across the plurality of programmable logic devices;
a multiplier circuit to receive the clock signal having the reference frequency, wherein the multiplier circuit multiplies the clock signal having the reference frequency by a first value to generate a clock signal having a multiplied frequency; and
a divider circuit to receive the reset signal from the reset circuit and to receive the clock signal having a multiplied frequency from the multiplier circuit, wherein the divider circuit is configured to divide the clock signal having the multiplied frequency by a second value to generate the user clock signal having the synchronized user clock frequency; and
interconnect electrically connecting the first programmable logic device to the clock generation circuit.

2. The apparatus for generating a user clock in a prototyping system of claim 1, further comprising:
a second programmable logic device to receive the clock signal having the reference frequency, comprising:
a second multiplier circuit to receive the clock signal having the reference frequency, wherein the multiplier circuit multiplies the clock signal having the reference frequency by the first value to generate a second clock signal having the multiplied frequency; and
a second divider circuit to receive the reset signal from the reset circuit and the second clock signal having a multiplied frequency from the second multiplier circuit, wherein the second divider circuit is configured to divide the clock signal having the multiplied frequency by the second value to generate a second user clock signal having the synchronized frequency, wherein the second user clock signal is in phase with the user clock; and
interconnect electrically connecting the second programmable logic device to the clock generation circuit and the first programmable logic device.

3. The apparatus for generating a user clock in a prototyping system of claim 1, wherein the reference frequency is substantially a maximum operating frequency of the programmable logic device.

4. The apparatus for generating a user clock in a prototyping system of claim 1, wherein the programmable logic device comprises a field-programmable gate array.

5. The apparatus for generating a user clock in a prototyping system of claim 4, wherein the multiplier circuit comprises a phase-locked loop, and wherein the second multiplier circuit comprises a second phase-locked loop.

6. A computer-implemented method of producing circuits for generating user clocks in a plurality of programmable logic devices of a prototyping system, comprising:
extracting a user clock from a circuit design, wherein the user clock has a user clock frequency;
partitioning the circuit design for programming into the plurality of programmable logic devices;
selecting a reference clock frequency and a scaled user clock frequency;
programming a first multiplier circuit and a first divider circuit into a first programmable logic device of the plurality of programmable logic devices to generate a first scaled user clock having the scaled user clock frequency from a reference clock having the reference clock frequency;
programming a second multiplier circuit and a second divider circuit into a second programmable logic device of the plurality of programmable logic devices to generate a second scaled user clock having the scaled user clock frequency from the reference clock having the reference clock frequency; and programming a reset circuit into the first programmable logic device to receive the clock signal having the reference clock frequency, and to transmit a reset signal to reset the first divider circuit and the second divider circuit to thereby synchronize the first scaled user clock and the second scaled user clock.

7. The computer-implemented method of producing circuits for generating user clocks in a plurality of programmable logic devices of a prototyping system of claim 6, wherein the reference clock frequency is substantially a maximum clock frequency of the programmable logic device.

8. The computer-implemented method of producing circuits for generating user clocks in a plurality of programmable logic devices of a prototyping system of claim 6, wherein the plurality of programmable logic devices comprise a plurality of field-programmable gate arrays.

9. The computer-implemented method of producing circuits for generating user clocks in a plurality of programmable logic devices of a prototyping system of claim 8, wherein the first multiplier circuit comprises a first phase locked-loop, and wherein the second multiplier circuit comprises a second phase locked-loop.

10. A computer-readable non-transitory storage medium having stored thereon a plurality of instructions, the plurality of instructions when executed by a computer, cause the computer to perform:

extracting a user clock from a circuit design, wherein the user clock has a user clock frequency;

partitioning the circuit design for programming into a plurality of programmable logic devices;

selecting a reference clock frequency and a scaled user clock frequency;

programming a first multiplier circuit and a first divider circuit into a first programmable logic device of the plurality of programmable logic devices to generate a first scaled user clock having the scaled user clock frequency from a reference clock having the reference clock frequency;

programming a second multiplier circuit and a second divider circuit into a second programmable logic device of the plurality of programmable logic devices to generate a second scaled user clock having the scaled user clock frequency from the reference clock having the reference clock frequency; and programming a reset circuit into the first programmable logic device to receive the clock signal having the reference clock frequency, and to transmit a reset signal to reset the first divider circuit and the second divider circuit to thereby synchronize the first scaled user clock and the second scaled user clock.

11. The computer-readable non-transitory storage medium of claim 10, wherein the reference clock frequency is substantially a maximum clock frequency of the programmable logic device.

12. The computer-readable non-transitory storage medium of claim 10, wherein the plurality of programmable logic devices comprise a plurality of field-programmable gate arrays.

13. The computer-readable non-transitory storage medium of claim 12, wherein the first multiplier circuit comprises a first phase locked-loop, and wherein the second multiplier circuit comprises a second phase locked-loop.

14. A computer-implemented method for generating a plurality of user clocks in a prototyping system, wherein the prototyping system comprises a plurality of prototyping resources, including a plurality of programmable logic devices, wherein the programmable logic devices are programmed with a portion of a circuit design, and wherein interconnect connects each programmable logic device to at least one other programmable logic device, comprising:

extracting a user clock frequency from the circuit design;

selecting a reference clock frequency for a reference clock signal;

programming a reset circuit into a first programmable logic device, wherein the reset circuit generates a reset signal;

programming a first multiplier circuit into the first programmable logic device, wherein the multiplier circuit receives the reference clock signal having the reference clock frequency, multiplies the reference clock frequency by a first multiply-by value, and outputs a clock signal having a first multiplied clock frequency;

programming a first divider circuit into the first programmable logic device, wherein the first divider circuit divides the clock signal having the first multiplied clock frequency by a first divide-by value, and wherein the first divider circuit outputs a first clock signal having the user clock frequency in response to the reset signal;

programming a second multiplier circuit into a second programmable logic device, wherein the multiplier circuit receives the reference clock signal having the reference clock frequency, multiplies the reference clock frequency by a second multiply-by value, and outputs a clock signal having a second multiplied clock frequency; and programming a second divider circuit into the second programmable logic device, wherein the second divider circuit divides the clock signal having the second multiplied clock frequency by a second divide-by value, and wherein the second divider circuit outputs a second clock signal having the user clock frequency in response to the reset signal, thereby synchronizing the first clock signal and the second clock signal.

15. The computer-implemented method for generating a plurality of user clocks in a prototyping system of claim 14, wherein the reference clock frequency is substantially a maximum clock frequency of the programmable logic device.

16. The computer-implemented method for generating a plurality of user clocks in a prototyping system of claim 14, wherein the first programmable logic device comprises a first field-programmable gate array, and wherein the second programmable logic device comprises a second field-programmable gate array.

17. The computer-implemented method for generating a plurality of user clocks in a prototyping system of claim 16, wherein the first multiplier circuit comprises a first phase locked-loop, and wherein the second multiplier circuit comprises a second phase locked-loop.

* * * * *